United States Patent
Zeng

(10) Patent No.: US 8,036,618 B2
(45) Date of Patent: Oct. 11, 2011

(54) AUTO GAIN CONTROLLER AND CONTROL METHOD THEREOF

(75) Inventor: Zhi-Ming Zeng, Taipei (TW)

(73) Assignee: Ali Corporation, Taipei (TW)

( * ) Notice: Subject to any disclaimer, the term of this patent is extended or adjusted under 35 U.S.C. 154(b) by 521 days.

(21) Appl. No.: 12/323,925

(22) Filed: Nov. 26, 2008

(65) Prior Publication Data

US 2010/0062736 A1 Mar. 11, 2010

(30) Foreign Application Priority Data

Sep. 9, 2008 (CN) .......................... 2008 1 0215913

(51) Int. Cl.
*H04B 1/06* (2006.01)
(52) U.S. Cl. .................. 455/234.1; 375/345; 455/250.1
(58) Field of Classification Search ............... 455/232.1, 455/234.1, 241.1, 245.2, 250.1, 251.1, 253.2; 375/345
See application file for complete search history.

(56) References Cited

U.S. PATENT DOCUMENTS

| 5,040,194 | A | 8/1991 | Tjahjadi et al. |
| 5,805,241 | A | 9/1998 | Limberg |
| 6,154,503 | A | 11/2000 | Strolle |
| 6,160,443 | A | 12/2000 | Maalej et al. |
| 6,654,594 | B1 * | 11/2003 | Hughes et al. ............. 455/245.1 |
| 7,116,955 | B2 * | 10/2006 | Schaffer et al. ........... 455/234.1 |
| 7,606,544 | B2 * | 10/2009 | Hennig ...................... 455/247.1 |
| 7,630,686 | B2 * | 12/2009 | Fukutani et al. ............ 455/63.1 |

FOREIGN PATENT DOCUMENTS

| CN | 1423486 | 6/2003 |
| CN | 1929568 | 3/2007 |

\* cited by examiner

*Primary Examiner* — Howard Williams
(74) *Attorney, Agent, or Firm* — J.C. Patents

(57) ABSTRACT

An auto gain controller (AGC) and a control method thereof are provided. An input signal is amplified by a radio frequency (RF) amplifier and an intermediate frequency (IF) amplifier. When strength of the input signal is lower than a threshold, a gain curve of the RF amplifier is lowered while a gain curve of the IF amplifier is raised. When the strength of the input signal is greater than the threshold, a takeover point (TOP) of the IF amplifier is changed from a first takeover point to a second takeover point.

16 Claims, 15 Drawing Sheets

FIG. 11

| Frequency(MHz) | Symbol rate (MHz) | Signal strength of adjacent channels of channel N (dB) | | | | | |
|---|---|---|---|---|---|---|---|
| | | Present invention | | Device A | | Device B | |
| | | Channel N+1 | Channel N-1 | Channel N+1 | Channel N-1 | Channel N+1 | Channel N-1 |
| 500 | 6.875 | 29.1 | 27 | 15.1 | 14.7 | 28.4 | 25.1 |
| 858 | 6.875 | 28.3 | 26.6 | 15.2 | 13.8 | 28.3 | 24.7 |

FIG. 12

| Frequency(MHz) | Symbol rate(MHz) | Signal strength of adjacent channels of channel N (dB) | | | | | |
|---|---|---|---|---|---|---|---|
| | | Present invention | | Device A | | Device B | |
| | | Channel N+1 | Channel N-1 | Channel N+1 | Channel N-1 | Channel N+1 | Channel N-1 |
| 500 | 6.875 | 23.1 | 24.5 | 13.9 | 13.8 | 23.5 | 23.3 |
| 858 | 6.875 | 23.9 | 23.6 | 15.2 | 14 | 24.5 | 22.6 |

| QAM | Symbol rate(MHz) | Channel | C/N(dB) | | |
|---|---|---|---|---|---|
| | | | Present invention | Device A | Device B |
| 64 | 6.875 | AWGN | 23.2 | 23.3 | 23.2 |
| 64 | 4 | AWGN | 23 | 23.1 | 23.1 |
| 256 | 6.875 | AWGN | 29.5 | 29.7 | 29.5 |
| 256 | 4 | AWGN | 29.3 | 29.5 | 29.4 |

FIG. 13

AUTO GAIN CONTROLLER AND CONTROL METHOD THEREOF

CROSS-REFERENCE TO RELATED APPLICATION

This application claims the priority benefit of China application serial no. 200810215913.X, filed on Sep. 9, 2008. The entirety of the above-mentioned patent application is hereby incorporated by reference herein and made a part of specification.

BACKGROUND OF THE INVENTION

1. Field of the Invention

The present invention generally relates to an auto gain controller (AGC) and a control method thereof, and more particularly, to a three-stage dual-loop AGC and a control method thereof for adaptively controlling the gain of a radio frequency (RF) amplifier and the gain of an intermediate frequency (IF) amplifier.

2. Description of Related Art

Along with the development of technologies, television set is no more necessary for watching television programs. Instead, television programs can be displayed on any display apparatus by using a set-top box or a video card. Besides, due to the advancement of communication and compression techniques, the conventional analog television broadcasting has been gradually replaced by digital television broadcasting. A user can receive analog television signals or digital television signals through an analog tuner or a digital tuner.

For wirelessly transmitting a television signal, the television signal is first converted into an intermediate frequency (IF) signal and then into a radio frequency (RF) signal by a transmitter. Then, the RF television signal is transmitted through an antenna of the transmitter. On the other hand, a receiver receives the RF television signal transmitted by the transmitter through an antenna thereof and then converts the RF television signal into a video signal by filtering and amplifying the RF television signal. Usually, the RF television signal received by a receiver is low in voltage level or in strength, thereby being not provided directly to a demodulator. Accordingly, the RF television signal received by the receiver has to be amplified. FIG. 1 is a functional block diagram of a conventional receiver 10. Referring to FIG. 1, the receiver 10 has an antenna (not shown), a RF filter 12, a RF amplifier 14, an IF filter 16, an IF amplifier 18, and an auto gain controller (AGC) 20. The RF filter 12 is a tracking filter, which converts an input signal $S_{IN}$ received through the antenna into a RF signal $S_{RF}$. The RF amplifier 14 amplifies the RF signal $S_{RF}$ and outputs an amplified RF signal $S_{ARF}$. The IF amplifier 18 is a surface acoustic wave (SAW) filter, which filters the amplified RF signal $S_{ARF}$ and outputs an IF signal $S_{IF}$ corresponding to the desired television channel. Thereafter, the IF amplifier 18 amplifies the IF signal $S_{IF}$ into an IF output signal $S_{OUT}$. Generally speaking, the frequency range of the RF signal $S_{RF}$ is wider than the frequency range of the IF signal $S_{IF}$.

In order to allow the level of the IF output signal $S_{OUT}$ to fall within an range acceptable to the demodulator, the AGC 20 determines the strength of the input signal $S_{IN}$ according to the IF output signal $S_{OUT}$ and outputs gain control signals AGC1 and AGC2 for respectively controlling the gain of the RF amplifier 14 and the gain of the IF amplifier 18. Since one gain control signal is used for controlling the gain of the RF amplifier 14 and the other gain control signal is used for controlling the gain of the IF amplifier 18, the gain control method described above is referred to as dual-loop auto gain control.

FIG. 2 illustrates the relationship between the RF gain $G_{RF}$ of the RF amplifier 14 and the strength of the input signal $S_{IN}$ and the relationship between the IF gain $G_{IF}$ of the IF amplifier 18 and the strength of the input signal $S_{IN}$. Referring to FIG. 2, the relationship between the RF gain $G_{RF}$ of the RF amplifier 14 and the strength of the input signal $S_{IN}$ is represented by a RF gain curve 32, and the relationship between the IF gain $G_{IF}$ of the IF amplifier 18 and the strength of the input signal $S_{IN}$ is represented by an IF gain curve 34. Besides, three different levels of strength $V_1$, $V_2$, and $V_3$ of the input signal $S_{IN}$ are illustrated in FIG. 2, wherein $V_1 < V_2 < V_3$.

Generally speaking, when the AGC 20 controls the gains of the RF amplifier 14 and the IF amplifier 18, the RF gain $G_{RF}$ does not exceed $G_{RF}^{max1}$, and the IF gain $G_{IF}$ does not exceed $G_{IF}^{max1}$. For example, when the strength of the input signal $S_{IN}$ is smaller than $V_1$, the RF gain $G_{RF}$ and the IF gain $G_{IF}$ are respectively equal to $G_{RF}^{max1}$ and $G_{IF}^{min1}$. Besides, when the strength of the input signal $S_{IN}$ is between $V_1$ and $V_2$, the RF gain $G_{RF}$ remains at $G_{RF}^{max1}$, and the IF gain $G_{IF}$ is gradually reduced from $G_{IF}^{max1}$ to $G_{IF}^{min1}$ along with the increasing strength of the input signal $S_{IN}$; when the strength of the input signal $S_{IN}$ is between $V_2$ and $V_3$, the IF gain $G_{IF}$ remains at $G_{IF}^{min1}$, and the RF gain $G_{RF}$ is gradually reduced from $G_{RF}^{max1}$ to $G_{RF}^{min1}$ along with the increasing strength of the input signal $S_{IN}$; and when the strength of the input signal $S_{IN}$ is greater than $V_3$, the RF gain $G_{RF}$ and the IF gain $G_{IF}$ are respectively equal to $G_{RF}^{min1}$ and $G_{IF}^{min1}$.

However, the problem of adjacent channel interference is not considered in the dual-loop auto gain control method described above. In other words, the image quality of a desired television channel may be affected when an adjacent channel has very strong signals.

SUMMARY OF THE INVENTION

In an existing digital television signal receiving system, adjacent television channels may interfere with each other and accordingly the performance of a receiver may be badly affected. According to the present invention, the operating points of an intermediate frequency (IF) amplifier and a radio frequency (RF) amplifier are optimized by changing a takeover point (TOP) for adjusting dual-loop auto gain control, so as to achieve an optimized linearity and to suppress adjacent channel interference.

The present invention provides an auto gain control method for controlling the gain of a radio frequency amplifier and the gain of an intermediate frequency amplifier and amplifying an input signal through the radio frequency amplifier and the intermediate frequency amplifier. The auto gain control method comprises: determining the strength of the input signal; lowering a gain curve of the radio frequency amplifier; raising a gain curve of the intermediate frequency amplifier; and when the strength of the input signal is greater than a threshold, providing a gain compensation to the intermediate frequency amplifier to reduce the gain of the intermediate frequency amplifier, wherein the output frequency range of the radio frequency amplifier is wider than the output frequency range of the intermediate frequency amplifier.

According to an embodiment of the present invention, the auto gain control method further comprises monitoring an output gain and the strength of the input signal. When the strength of the input signal is greater than the threshold, the gain compensation to the intermediate frequency amplifier is provided to reduce the gain of the intermediate frequency amplifier.

The present invention provides an auto gain controller (AGC) including a power calculator, a comparator, a gain step selector, a radio frequency auto gain controller, and an intermediate frequency auto gain controller. The power calculator determines the strength of an input signal. The comparator is coupled to the power calculator for comparing the strength of the input signal with a predetermined threshold. The gain step selector is coupled to the comparator. The radio frequency auto gain controller is coupled to the gain step selector and lowers down the gain curve of a radio frequency amplifier. The intermediate frequency auto gain controller is coupled to the gain step selector and has a first intermediate frequency auto gain control loop and a second intermediate frequency auto gain control loop. The first intermediate frequency auto gain control loop and the second intermediate frequency auto gain control loop control an intermediate frequency gain of an intermediate frequency amplifier. The gain step selector turns on the first intermediate frequency auto gain control loop and the second intermediate frequency auto gain control loop in a stepping manner according to the comparison result of the comparator.

According to an embodiment of the present invention, the gain curve of the intermediate frequency amplifier has takeover points and the step of providing a gain compensation to the intermediate frequency amplifier carries out by changing the takeover point from a first takeover point to a second takeover point.

The present invention provides a auto gain control method of a three-stage dual-loop, for controlling the gain of a radio frequency amplifier and the gain of an intermediate frequency amplifier and amplifying an input signal through the radio frequency amplifier and the intermediate frequency amplifier. The three-stage dual-loop auto gain control method comprises: determining the strength of the input signal; lowering a gain curve of the radio frequency amplifier and raising a gain curve of the intermediate frequency amplifier if the strength of the input signal is lower than a threshold; and changing a takeover point of the gain curve of the intermediate frequency amplifier from a first takeover point to a second takeover point if the strength of the input signal is greater than a threshold, wherein the strength of the input signal corresponding to the second takeover point is greater than the strength of the input signal corresponding to the first takeover point, the gain of the intermediate frequency amplifier corresponding to the second takeover point is smaller than the gain of the intermediate frequency amplifier corresponding to the first takeover point, and the output frequency range of the radio frequency amplifier is wider than the output frequency range of the intermediate frequency amplifier.

According to an embodiment of the present invention, a gain compensation is provided to the intermediate frequency amplifier to reduce the gain of the intermediate frequency amplifier when the takeover point of the gain curve of the intermediate frequency amplifier is changed from the first takeover point to the second takeover point.

According to an embodiment of the present invention, the gain curve of the radio frequency amplifier represents the relationship between the gain of the radio frequency amplifier and the strength of the input signal, and the gain curve of the intermediate frequency amplifier represents the relationship between the gain of the intermediate frequency amplifier and the strength of the input signal.

According to an embodiment of the present invention, the input signal is first raised by the radio frequency amplifier and then raised by the intermediate frequency amplifier when signal level is begun with a small value.

According to an embodiment of the present inversion, the input signal is first lowered by intermediate frequency amplifier and then lowered by radio frequency amplifier when signal level is begun with a larger value.

According to an embodiment of the present invention, the strength of the input signal is the power or voltage level of the input signal.

According to an embodiment of the present invention, the first intermediate frequency AGC loop, the second intermediate frequency AGC loop, and the radio frequency AGC respectively comprise a loop filter and an integrator, wherein each of the loop filters is a low-pass filter for filtering through a signal outputted from the gain step selector, and each of the integrators accumulates a signal outputted from the corresponding loop filter.

According to an embodiment of the present invention, the intermediate frequency AGC further comprises an adder, a delta-sigma digital to analog converter, and a RC analog filter, wherein the adder sums up digital outputs of the integrators of the first intermediate frequency AGC loop and the second intermediate frequency AGC loop, the delta-sigma digital to analog converter performs a delta-sigma digital to analog conversion for an output of the adder, and the RC analog filter transforms an alternating current (AC) output of the delta-sigma digital to analog converter into a direct current (DC) output.

According to an embodiment of the present invention, the radio frequency AGC further comprises a delta-sigma digital to analog converter and a RC analog filter, wherein the delta-sigma digital to analog converter performs a delta-sigma digital to analog conversion for the output of the integrator of the radio frequency AGC, and the RC analog filter transforms an AC output of the delta-sigma digital to analog converter into a DC output.

According to an embodiment of the present invention, when the strength of the input signal is lower than the predetermined threshold, the gain step selector enables the first intermediate frequency AGC loop and disables the second intermediate frequency AGC loop, and when the strength of the input signal is greater than the predetermined threshold, the gain step selector enables the second intermediate frequency AGC loop and disables the first intermediate frequency AGC loop.

According to an embodiment of the present invention, when the strength of the input signal is lower than the predetermined threshold, the first intermediate frequency AGC loop raises the gain curve of the intermediate frequency amplifier.

According to an embodiment of the present invention, when the strength of the input signal is greater than the predetermined threshold, the second intermediate frequency AGC loop provides a gain compensation to the intermediate frequency amplifier to reduce the gain of the intermediate frequency amplifier.

In order to resolve the problem in the conventional technique, the present invention provides a three-stage dual-loop auto gain control structure for respectively controlling the gain of a radio frequency amplifier and the gain of an intermediate frequency amplifier, wherein the gain of the intermediate frequency amplifier is controlled in two stages. Thereby, the three-stage dual-loop auto gain control structure provided by the present invention is very simple and practical, such that not only the problem of adjacent channel rejection is resolved, but also the quality of output signals when receiving strong input signals is ensured.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 11 is a table comparing the performance of the receiver in FIG. 10 and other devices in suppressing adjacent channel interference.

FIG. 12 is a table comparing the performance of the receiver in FIG. 10 and other devices in suppressing adjacent channel interference under another testing environment.

FIG. 13 is a table comparing the signal-to-noise ratios (SNR) of the receiver in FIG. 10 and other devices.

DESCRIPTION OF THE EMBODIMENTS

Figure 1:
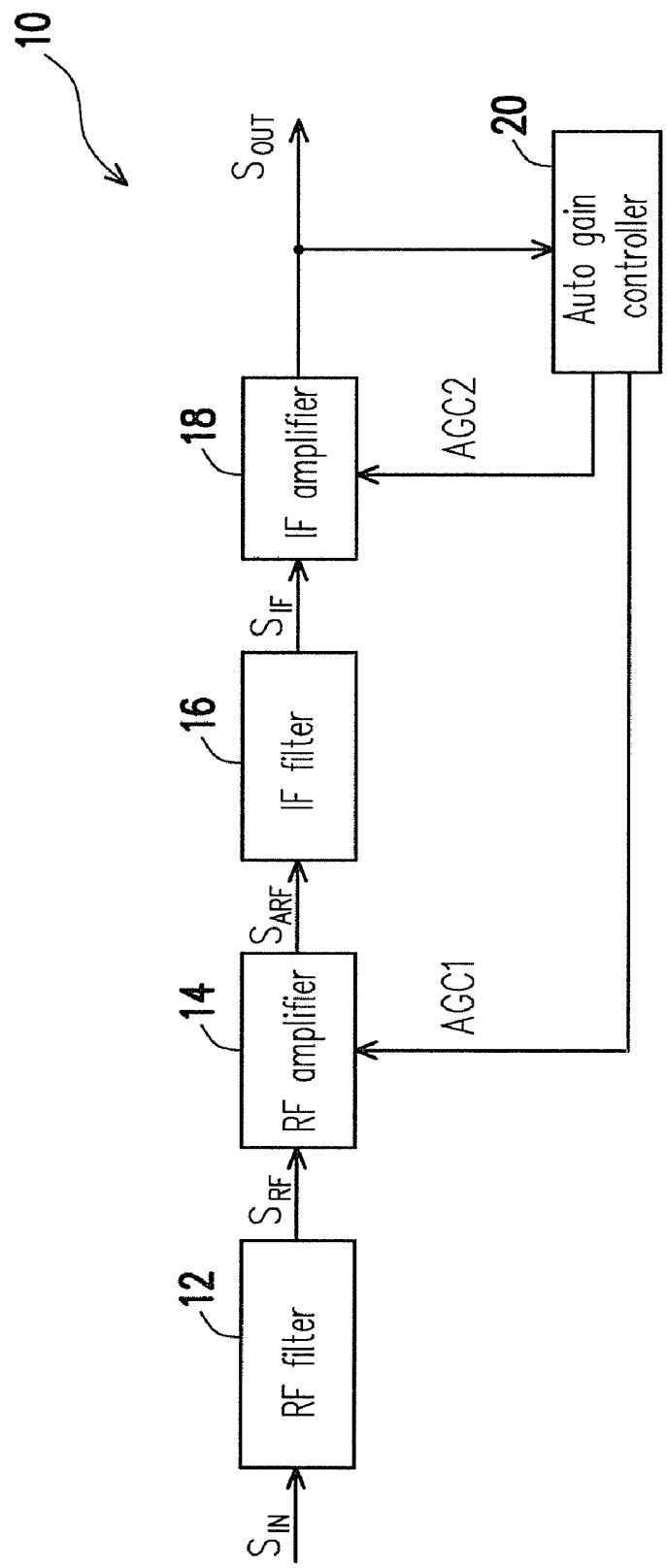
FIG. 1 is a functional block diagram of a conventional receiver.
Figure 2:
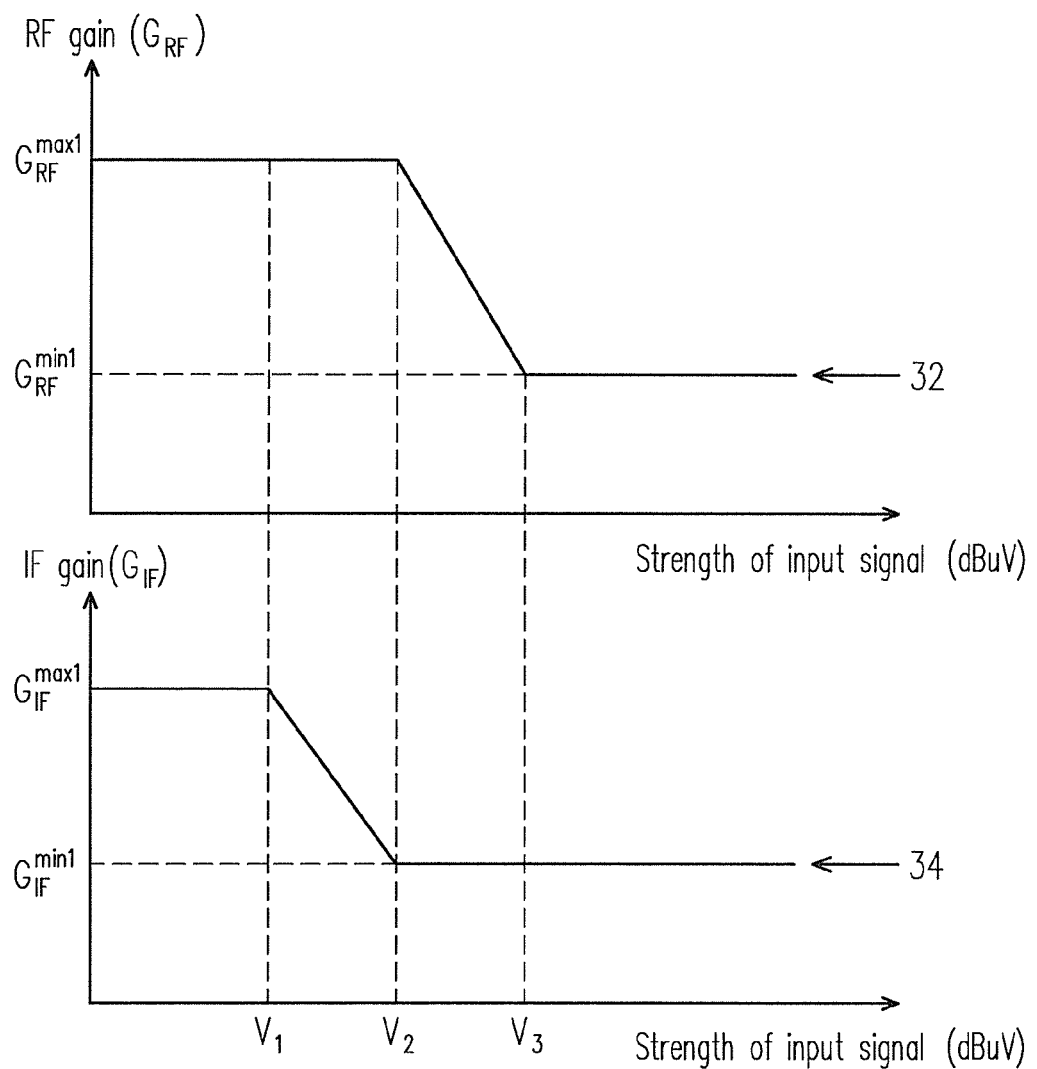
FIG. 2 illustrates the relationship between a radio frequency (RF) gain of a RF amplifier in FIG. 1 and the strength of an input signal and the relationship between an intermediate frequency (IF) gain of an IF amplifier in FIG. 1 and the strength of the input signal.

Reference will now be made in detail to the present preferred embodiments of the invention, examples of which are illustrated in the accompanying drawings. Wherever possible, the same reference numbers are used in the drawings and the description to refer to the same or like parts.

Figure 3:
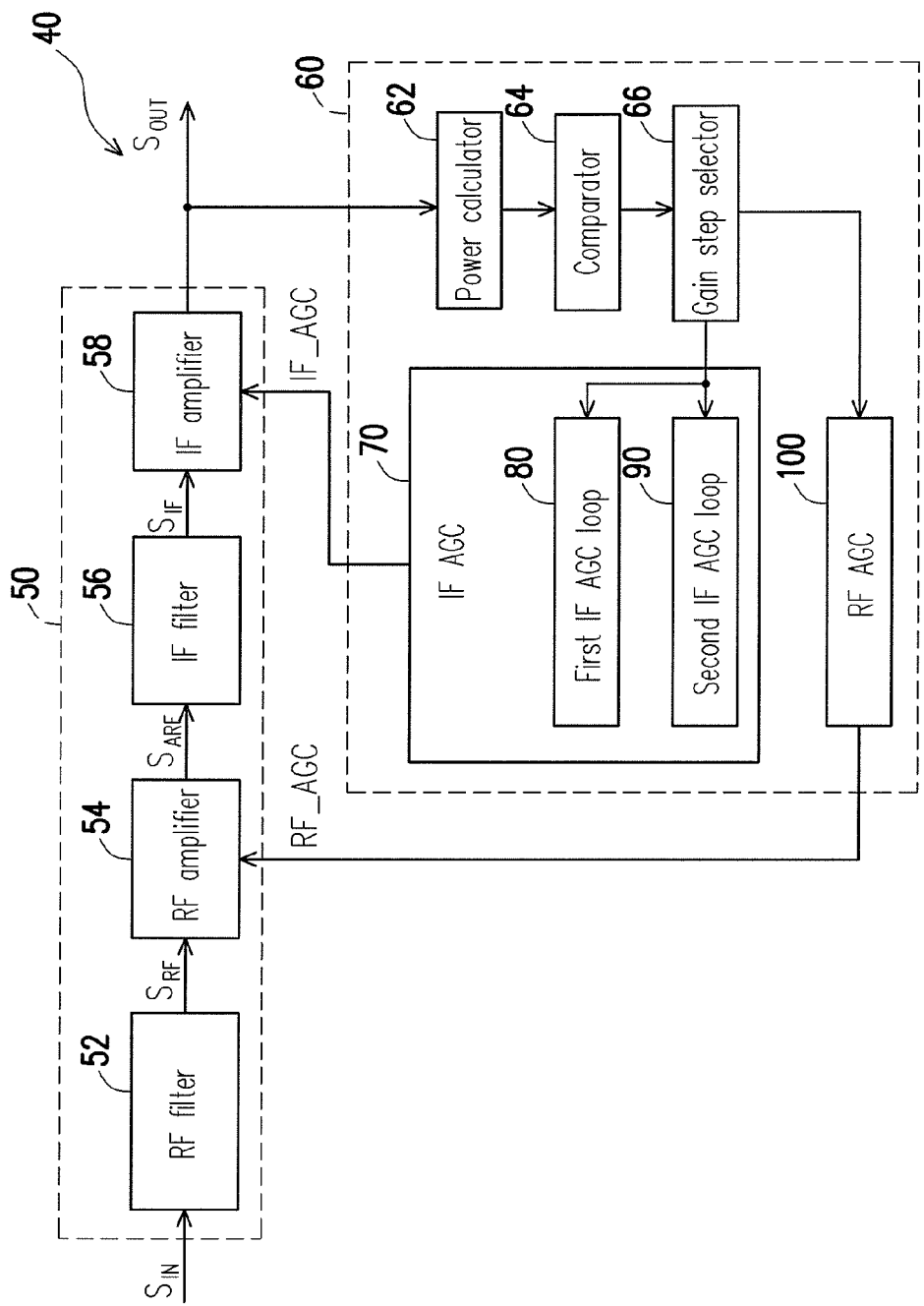
FIG. 3 is a functional block diagram of a receiver according to an embodiment of the present invention.

FIG. 3 is a functional block diagram of a receiver 40 according to an embodiment of the present invention. Referring to FIG. 3, the receiver 40 has a tuner 50 and an auto gain controller (AGC) 60. The tuner 50 converts an input signal $S_{IN}$ of radio frequency (RF) into an output signal $S_{OUT}$ of intermediate frequency (IF). The tuner 50 has a RF filter 52, a RF amplifier 54, an IF filter 56, and an IF amplifier 58. Some components are no difference between the present invention and the conventional technique, such as the RF filter 52, the RF amplifier 54, the IF filter 56, and the IF amplifier 58 in the present invention respectively have the same circuit characteristic and structure as the RF filter 12, the RF amplifier 14, the IF filter 16, and the IF amplifier 18 illustrated in FIG. 1. In other words, the RF filter 52 is a tracking filter, which converts an input signal $S_{IN}$ received form an antenna thereof into a RF signal $S_{RF}$. The RF amplifier 54 amplifies the RF signal $S_{RF}$ and outputs an amplified RF signal $S_{ARF}$. The IF filter 56 is a surface acoustic wave (SAW) filter, which filters the amplified RF signal $S_{ARF}$ and outputs an IF signal $S_{IF}$ corresponding to the desired television channel. Thereafter, the IF amplifier 58 amplifies the IF signal $S_{IF}$ into an IF output signal $S_{OUT}$. Similarly, the frequency range of the RF signal $S_{RF}$ is wider than the frequency range of the IF signal $S_{IF}$.

The AGC 60 has a power calculator 62, a comparator 64, a gain step selector 66, an IF AGC 70, and a RF AGC 100. The input terminal of the power calculator 62 is coupled to the output terminal of the tuner 50, and the power calculator 62 determines the strength of the input signal $S_{IN}$ according to the IF output signal $S_{OUT}$ outputted from the IF amplifier 58, wherein the strength of the input signal $S_{IN}$ determined by the power calculator 62 may be the power or voltage level of the input signal $S_{IN}$, and the unit thereof is usually denoted as dBuV. The input terminal of the comparator 64 is coupled to the output terminal of the power calculator 62. The comparator 64 compares the strength of the input signal $S_{IN}$ with a predetermined threshold and controls the operation of the gain step selector 66 according to the comparison result. The input terminal of the gain step selector 66 is coupled to the output terminal of the comparator 64, and the gain step selector 66 turns on a first intermediate frequency auto gain control (IF AGC) loop 80 and/or a second IF AGC loop 90 of the IF AGC 70 in a stepping manner according to the comparison result of the comparator 64. For example, when the strength of the input signal $S_{IN}$ is lower than the predetermined threshold, the gain step selector 66 enables the first IF AGC loop 80 and disables the second IF AGC loop 90, and when the strength of the input signal $S_{IN}$ is greater than the predetermined threshold, the gain step selector 66 enables the second IF AGC loop 90 and disables the first IF AGC loop 80. In one embodiment of the present invention, by comparing the IF output signal $S_{OUT}$ with a predefined threshold and by comparing a gain of the AGC 60 with an takeover point (TOP), it is determined whether the strength of the input signal $S_{IN}$ is lower than the predetermined threshold or not. In addition, the IF AGC 70 and the RF AGC 100 respectively output an IF control signal IF_AGC and a RF control signal RF_AGC to the IF amplifier 58 and the RF amplifier 54 according to the strength of the input signal $S_{IN}$ determined by the power calculator 62, so as to control the gains of the IF amplifier 58 and the RF amplifier 54.

Figure 4:
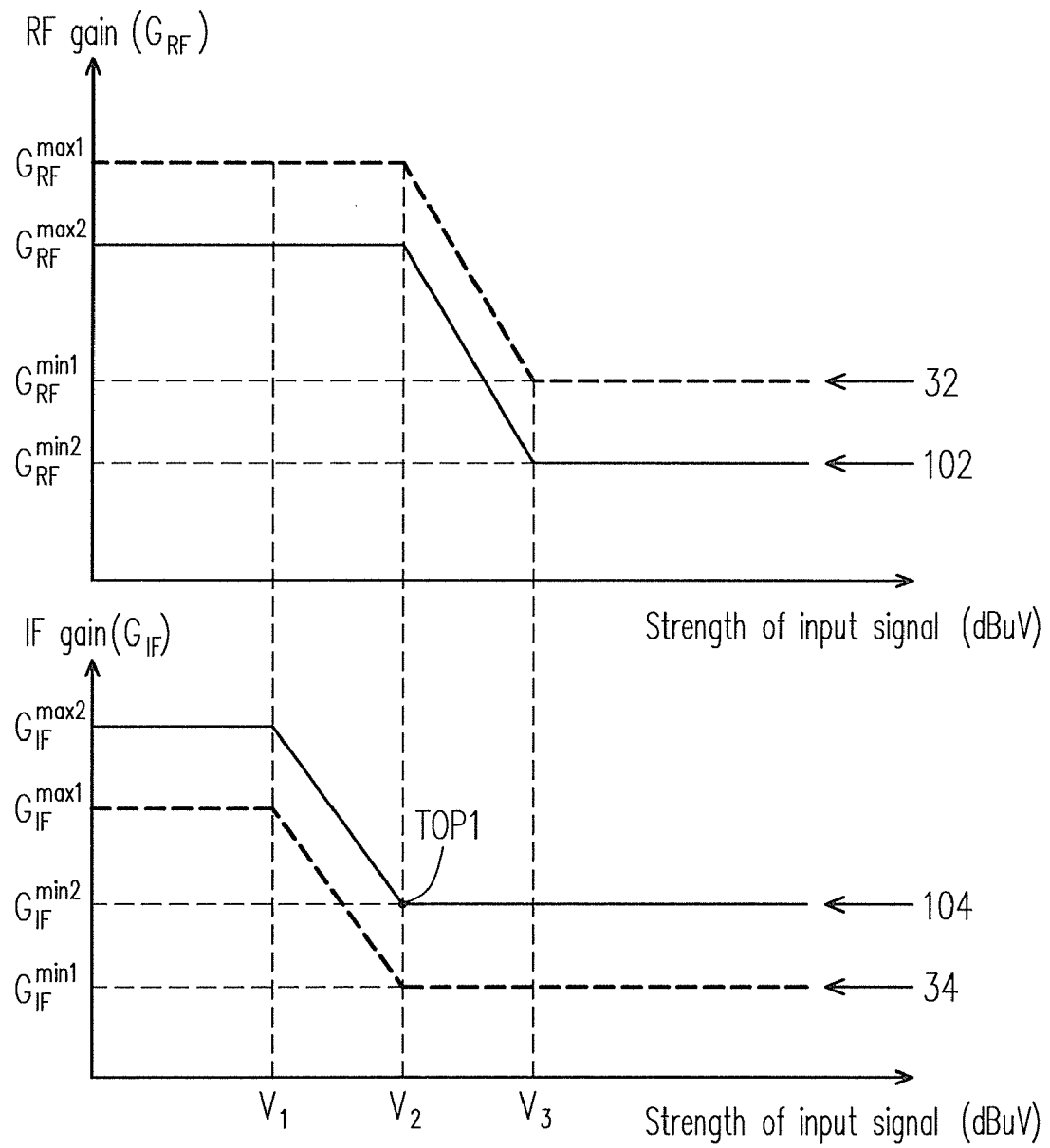
FIG. 4 illustrates a gain curve of a RF amplifier in FIG. 3 and a gain curve of an IF amplifier in FIG. 3.

FIG. 4 illustrates a gain curve 102 of the RF amplifier 54 and a gain curve 104 of the IF amplifier 58, wherein the gain curve 102 represents the relationship between the gain $G_{RF}$ of the RF amplifier 54 and the strength of the input signal $S_{IN}$, and the gain curve 104 represents the relationship between the gain $G_{IF}$ of the IF amplifier 58 and the strength of the input signal $S_{IN}$. According to the present invention, in order to suppress signal interference of adjacent channels, the gain $G_{RF}$ of the RF amplifier 54 is reduced and the gain $G_{IF}$ of the IF amplifier 58 is increased. To be specific, the gain curve of the RF amplifier 54 is lowered from a predetermined gain curve 32 to the gain curve 102, and the gain curve of the IF amplifier 58 is raised from a predetermined gain curve 34 to the gain curve 104. As shown in FIG. 4, the maximum value of the gain $G_{RF}$ of the RF amplifier 54 is lowered from $G_{RF}^{max1}$ to $G_{RF}^{max2}$, and the minimum value thereof is lowered from $G_{RF}^{min1}$ to $G_{RF}^{min2}$. On the other hand, the maximum value of the gain $G_{IF}$ of the IF amplifier 58 is raised from $G_{IF}^{max1}$ to $G_{IF}^{max2}$, and the minimum value thereof is raised from $G_{IF}^{min1}$ to $G_{IF}^{min2}$. Since the gain curve of the RF amplifier 54 is lowered, the signal power of the adjacent channel is effectively suppressed. In addition, even though the signal gain of the watched channel is reduced due to the lowered gain curve of the RF amplifier 54, the loss in RF gain of the signal in the watched channel is compensated by the IF gain due to the gain curve of the IF amplifier 58 raised. Accordingly, not only the signal interference of the adjacent channel is suppressed, but the signal gain of the watched channel is sustained.

Figure 5:
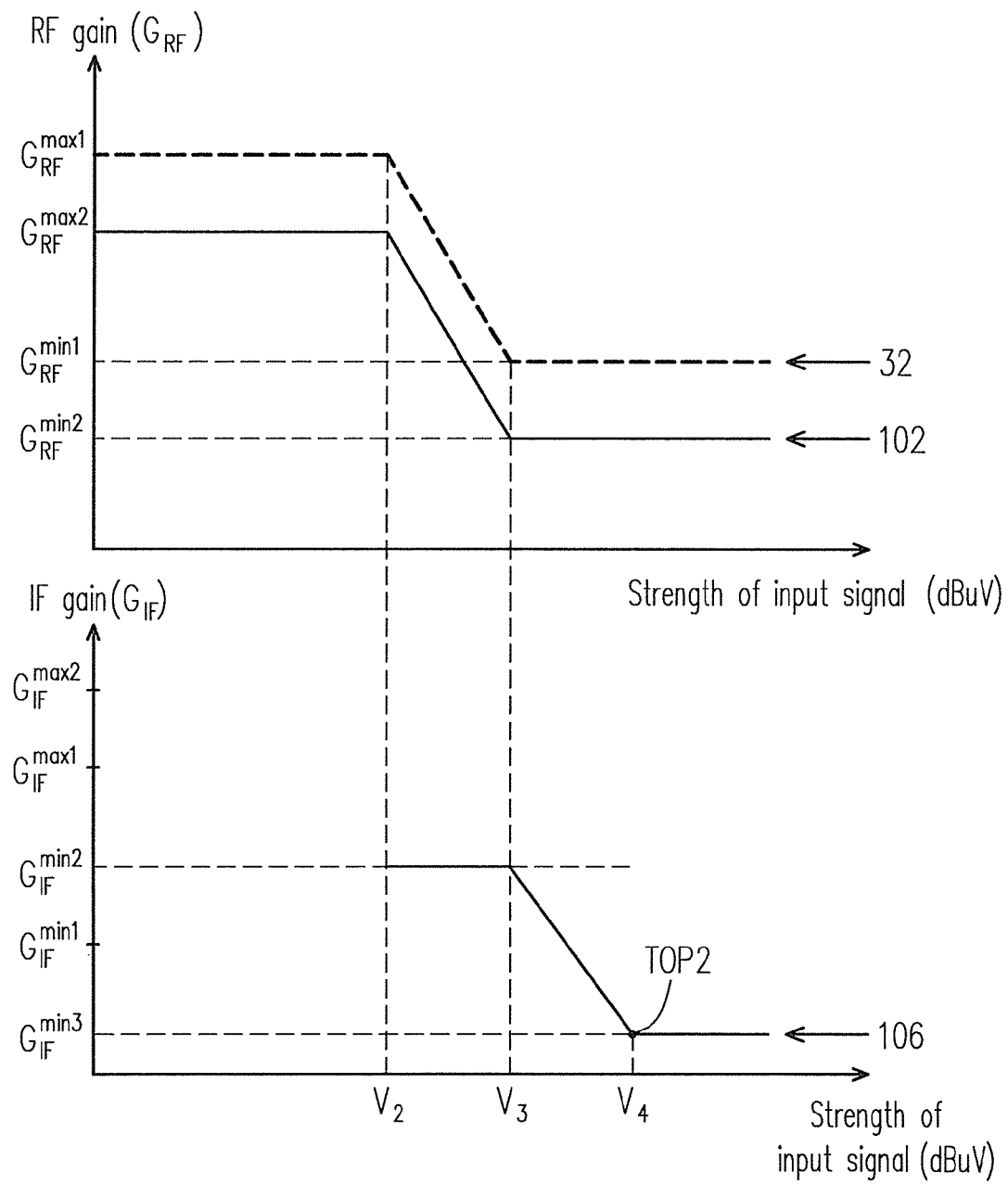
FIG. 5 illustrates the gain curve of the RF amplifier in FIG. 3 and a compensation gain curve of the IF amplifier in FIG. 3.

In the present invention, the adjustment in strong input signal $S_{IN}$ is further considered in order to prevent the input signal $S_{IN}$ from being too strong (for example, the strength thereof being greater than 90 dBuv) and accordingly reducing the image quality. FIG. 5 illustrates the gain curve 102 of the RF amplifier 54 and a compensation gain curve 106 of the IF amplifier 58. Referring to FIGS. 3, 4, and 5, in the present embodiment, when the strength of the input signal $S_{IN}$ is smaller than $V_2$, the first IF AGC loop 80 is enabled and the second IF AGC loop 90 is disabled so that the gain curve of the IF amplifier 58 is the gain curve 104. However, when the strength of the input signal $S_{IN}$ is greater than $V_2$, the first IF AGC loop 80 is disabled and the second IF AGC loop 90 is enabled so that the compensation gain curve 106 is generated and a gain compensation is provided to the IF amplifier 58 to reduce the gain $G_{IF}$ of the IF amplifier 58. Thus, when the input signal $S_{IN}$ has a very large strength, the gain $G_{IF}$ of the IF amplifier 58 is controlled at an appropriate value through the gain compensation provided by the compensation gain curve 106, so that early overflow of signal power can be prevented.

In another embodiment of the present invention, the compensation gain curve 106 may be obtained by adjusting a takeover point (TOP) of the gain curve of the IF amplifier 58. To be specific, when the strength of the input signal $S_{IN}$ is smaller than $V_2$, the gain curve of the IF amplifier 58 is the gain curve 104, and the takeover point thereof is a first takeover point TOP1. When the strength of the input signal $S_{IN}$ is greater than $V_2$, the gain curve of the IF amplifier 58 is changed from the gain curve 104 to the compensation gain curve 106, and the takeover point thereof is changed from the first takeover point TOP1 to a second takeover point TOP2. As shown in FIG. 4 and FIG. 5, the strength $V_4$ of the input signal $S_{IN}$ corresponding to the second takeover point TOP2 is greater than the strength $V_2$ of the input signal $S_{IN}$ corresponding to the first takeover point TOP1, and the gain $G_{IF}^{min3}$ of the IF amplifier 58 corresponding to the second takeover point TOP2 is smaller than the gain $G_{IF}^{min2}$ of the IF amplifier 58 corresponding to the first takeover point TOP1.

Regardless of whether a gain compensation is provided to the IF amplifier 58 or the takeover point of the gain curve of the IF amplifier 58 is changed, the purpose is always to reduce the gain $G_{IF}$ of the IF amplifier 58 so as to control the strength of the IF output signal $S_{OUT}$ to be at an appropriate level when the input signal $S_{IN}$ has a large strength. In addition, the gain $G_{IF}$ of the IF amplifier 58 is controlled in two stages in the present invention, which is different from the single-stage auto gain control performed to an IF amplifier in the conventional technique. Moreover, since the RF amplifier 54 adopts the single-stage auto gain control, the AGC 60 in the present invention can be referred to as a three-stage dual-loop AGC, and the auto gain control method in the present invention can be referred to as a three-stage dual-loop auto gain control method.

Figure 6:
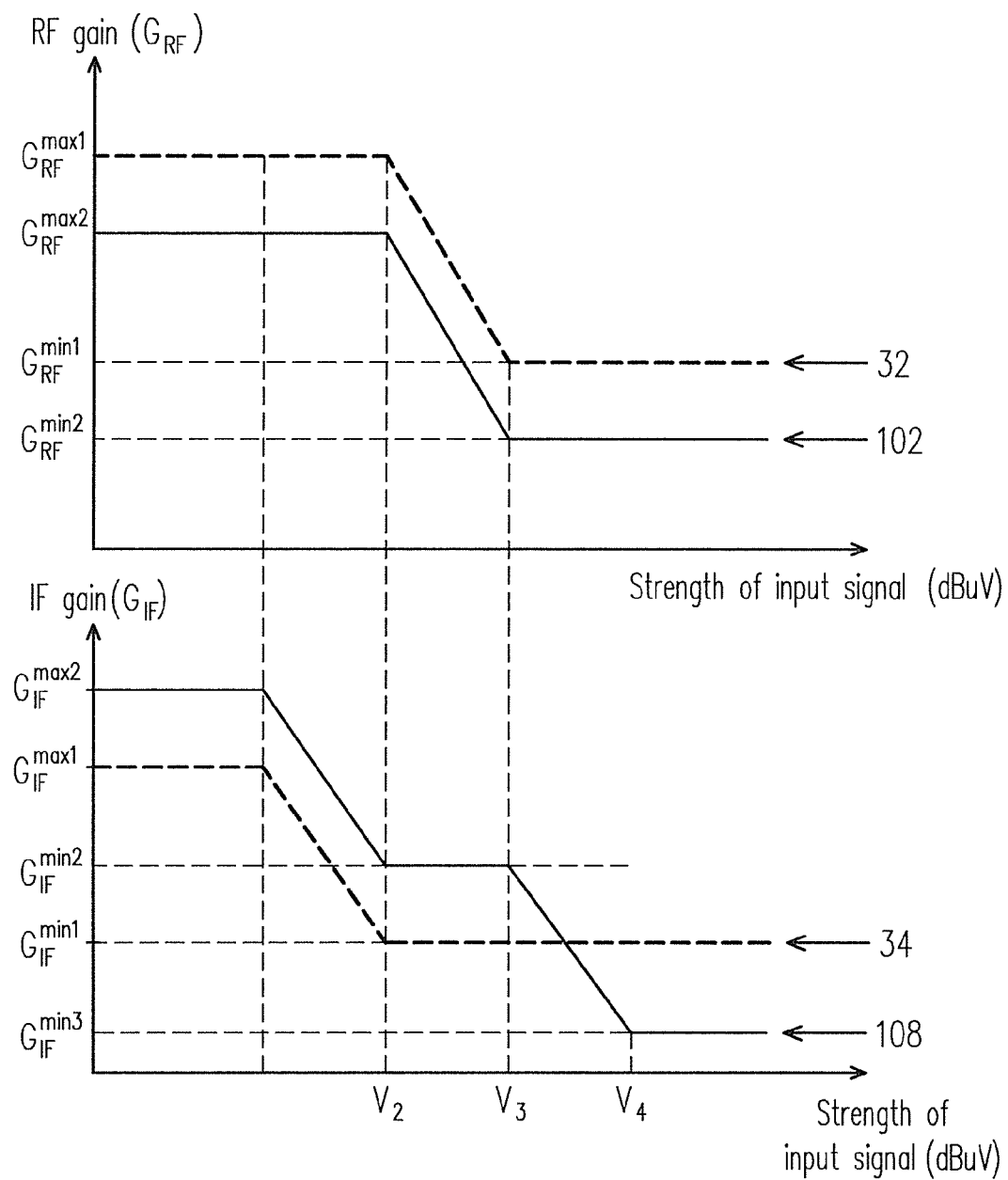
FIG. 6 illustrates the gain curve of the RF amplifier in FIG. 3 and an equivalent gain curve of the IF amplifier in FIG. 3.

FIG. 6 illustrates the gain curve 102 of the RF amplifier 54 and an equivalent gain curve 108 of the IF amplifier 58. Referring to FIG. 6, the equivalent gain curve 108 is obtained by integrating the gain curve 104 and the compensation gain curve 106. Besides, in order to clearly reflect the difference between the present invention and the conventional technique, the predetermined gain curve 32 of the RF amplifier 54 and the predetermined gain curve 34 of the IF amplifier 58 are further illustrated in FIG. 6.

Figure 7:
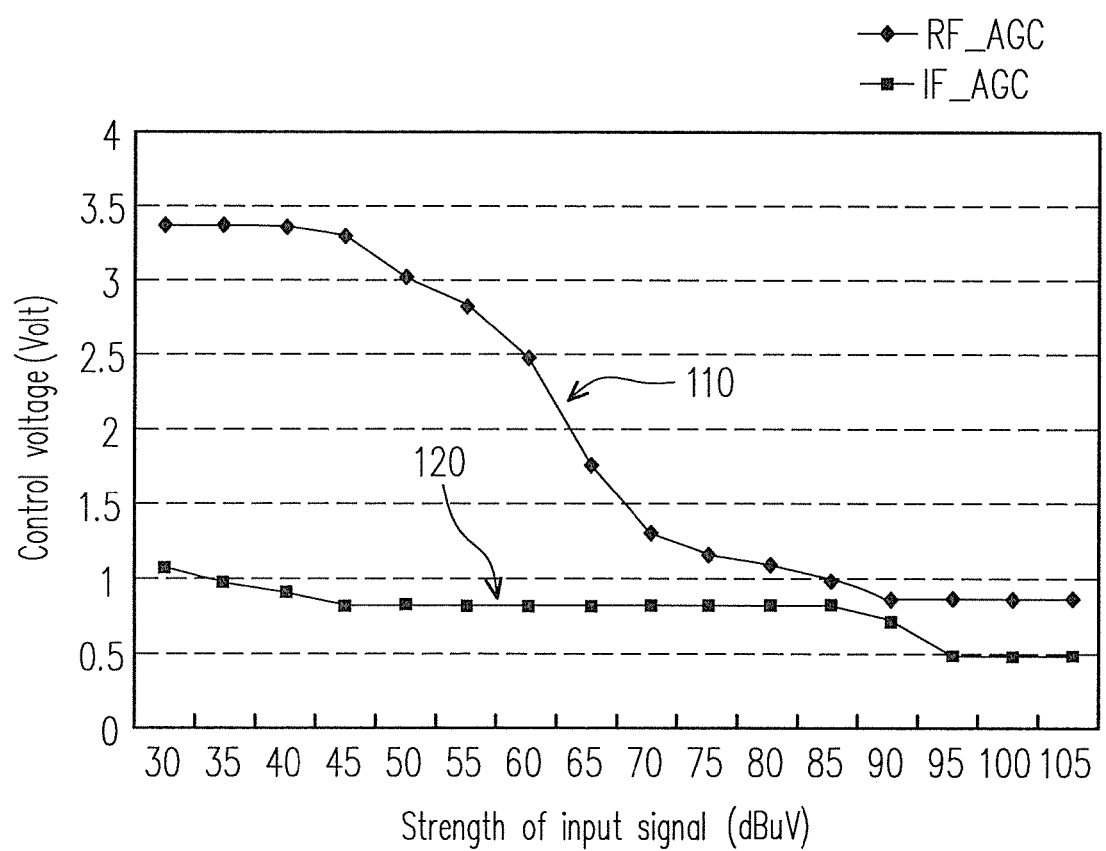
FIG. 7 illustrates the relationship between a RF control signal in FIG. 3 and the strength of an input signal and the relationship between an IF control signal in FIG. 3 and the strength of the input signal.

FIG. 7 illustrates the relationship between the RF control signal RF_AGC and the strength of the input signal $S_{IN}$ and the relationship between the IF control signal IF_AGC and the strength of the input signal $S_{IN}$. Referring to FIG. 7, the abscissa indicates the strength of the input signal $S_{IN}$, and the ordinate indicates the voltages of the RF control signal RF_AGC and the IF control signal IF_AGC. The curves 110 and 120 respectively represent the relationship between the RF control signal RF_AGC and the strength of the input signal $S_{IN}$ and the relationship between the IF control signal IF_AGC and the strength of the input signal $S_{IN}$. As shown in FIG. 7, the greater strength of the input signal $S_{IN}$ is, the smaller voltages of the RF control signal RF_AGC and the IF control signal IF_AGC are. Contrarily, the lower strength of the input signal $S_{IN}$ is, the larger voltages of the RF control signal RF_AGC and the IF control signal IF_AGC are. It should be noted that in the present embodiment, the gain $G_{RF}$ of the RF amplifier 54 and the gain $G_{IF}$ of the IF amplifier 58 change along with the voltages of the RF control signal RF_AGC and the IF control signal IF_AGC. A higher voltage of the RF control signal RF_AGC is corresponding to a greater gain $G_{RF}$ of the RF amplifier 54. Similarly, a higher voltage of the IF control signal IF_AGC is corresponding to a greater gain $G_{IF}$ of the IF amplifier 58.

Figure 8:
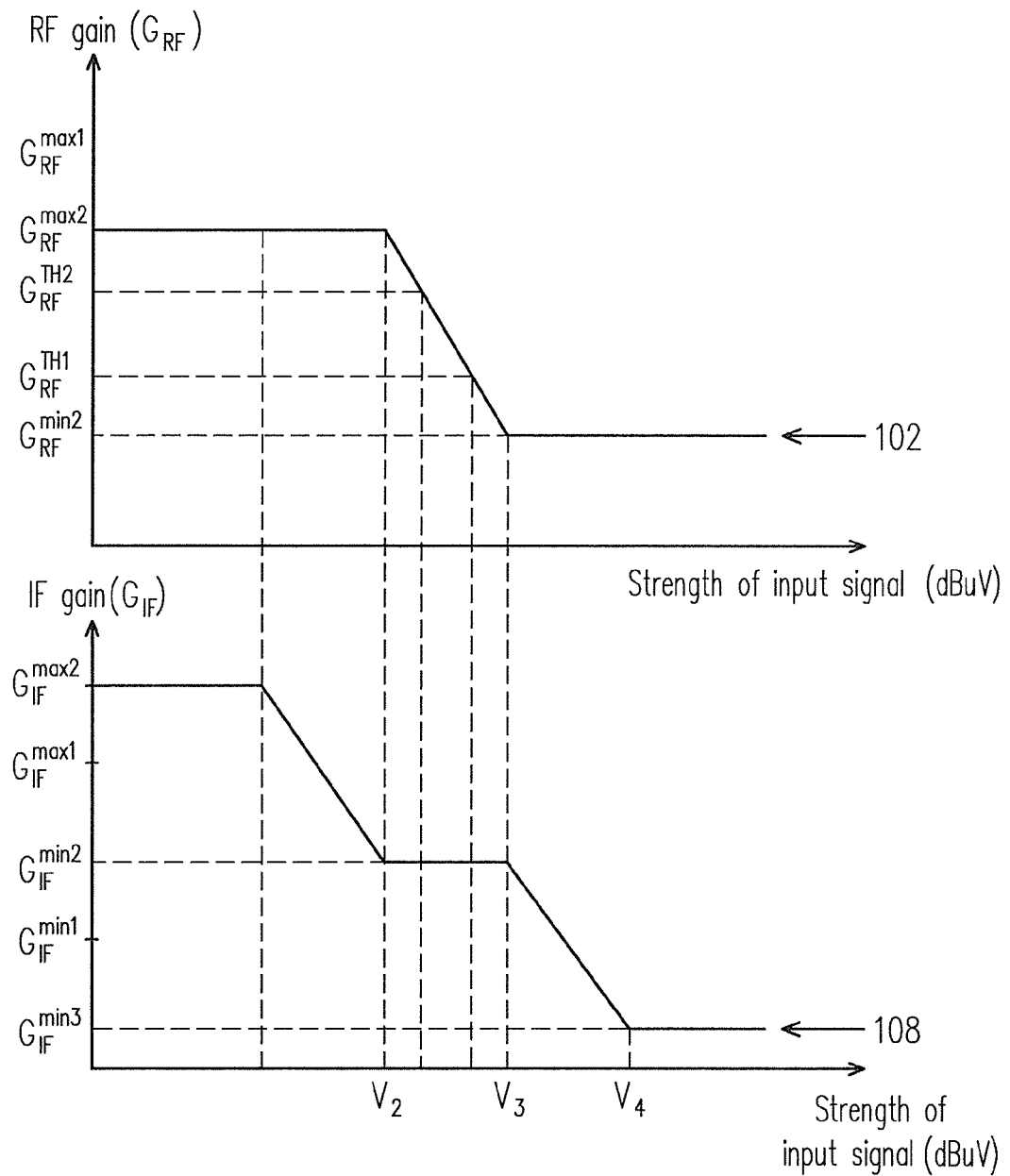
FIG. 8 illustrates how to change a takeover point of an IF gain curve by using a software.

According to the present invention, besides the circuit structure illustrated in FIG. 3, software may also be used for achieving the three-stage dual-loop auto gain control. FIG. 8 illustrates how to change a takeover point of an IF gain curve through the software. In the present embodiment, the takeover point of an IF gain curve is changed according to the RF gain $G_{RF}$. To be specific, as shown in FIG. 8, whether the takeover point of an IF gain curve is determined to change according to a first RF gain comparison threshold $G_{RF}^{TH1}$ and a second RF gain comparison threshold $G_{RF}^{TH2}$. When the RF gain $G_{RF}$ is lower than the first RF gain comparison threshold $G_{RF}^{TH1}$, which means the input signal $S_{IN}$ is a strong signal therefore requires a smaller gain, the minimum TOP threshold of the IF gain $G_{IF}$ is then set to $G_{IF}^{min3}$, namely, the IF gain $G_{IF}$ is not smaller than $G_{IF}^{min3}$. On the other hand, when the RF gain $G_{RF}$ is greater than the second comparison threshold of the RF gain $G_{RF}^{TH2}$, which means the input signal $S_{IN}$ is a weak signal therefore requires a greater gain, the minimum TOP threshold of the IF gain $G_{IF}$ is then set to $G_{IF}^{min2}$, namely, the IF gain $G_{IF}$ is not smaller than $G_{IF}^{min2}$. As shown in FIG. 8, $G_{IF}^{min2}$ is greater than $G_{IF}^{min3}$.

Figure 9:
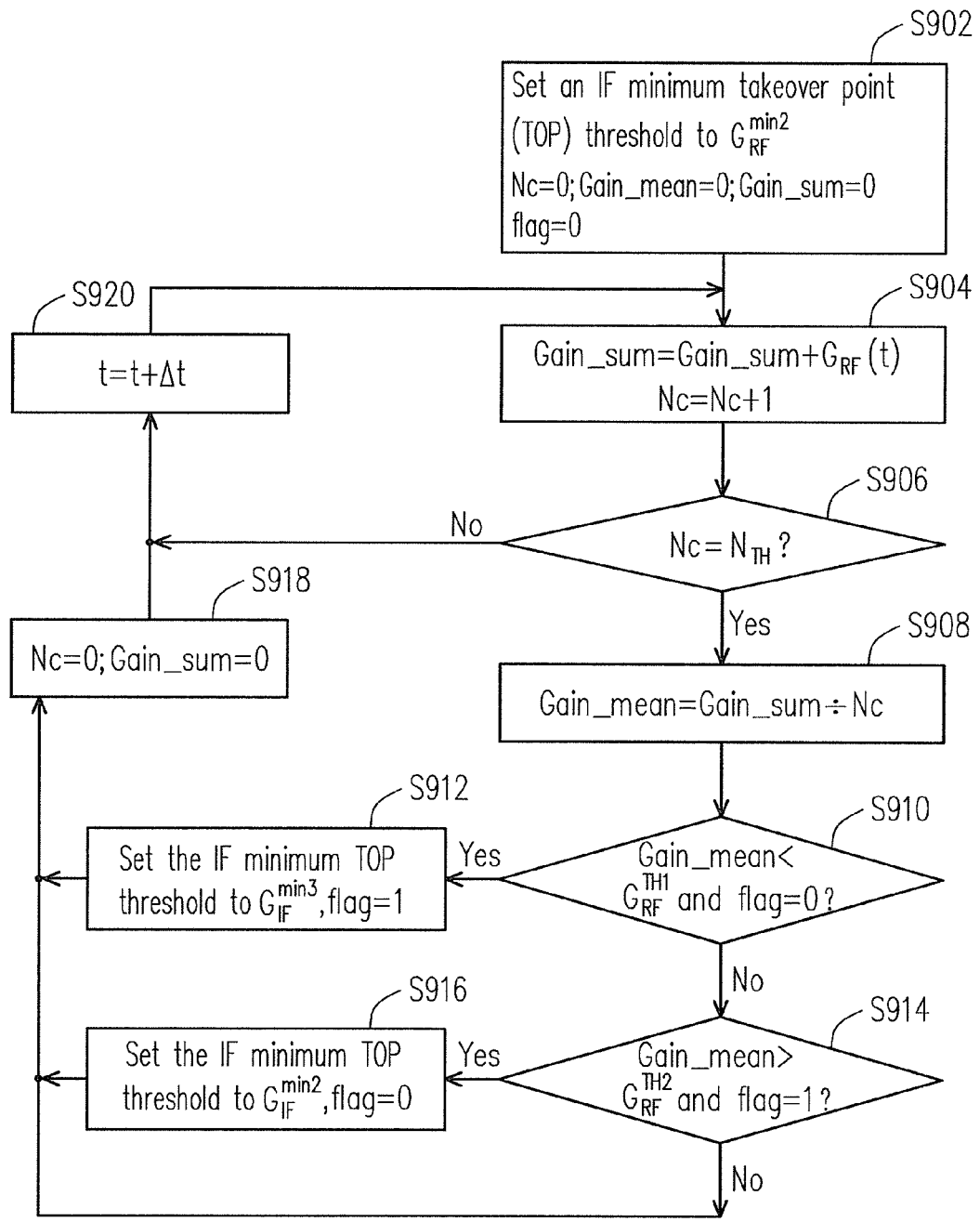
FIG. 9 is a flowchart illustrating how to change a takeover point of an IF gain curve according to the present invention.

FIG. 9 is a flowchart illustrating how to change a takeover point of an IF gain curve according to the present invention. First, the minimum TOP threshold of the IF amplifier is set to $G_{IF}^{min2}$, and besides, a parameter Nc indicating an accumulated number, a parameter Gain_mean indicating a mean RF gain, a parameter Gain_sum indicating a RF gain sum, and a parameter flag indicating a TOP state are set to 0 (step S902). Then, the current RF gain $G_{RF}(t)$ is accumulated to the mean RF gain Gain_mean and the accumulated number Nc is increased by 1 at intervals of a predetermined time delay $\Delta t$ (step S904), wherein the predetermined time delay $\Delta t$ is preset to 10 ms, and $G_{RF}(t)$ represents the RF gain $G_{RF}$ at time t.

It should be noted that the predetermined time delay Δt may also be set to other values. After that, the accumulated number Nc is compared with a system accumulated number threshold $N_{TH}$ (step S906), wherein the system accumulated number threshold $N_{TH}$ is a positive integer greater than 1, and in the present embodiment, the system accumulated number threshold $N_{TH}$ is set to 20. It should be noted that for the convenience of counting and resetting the accumulated number Nc, the system accumulated number threshold $N_{TH}$ can be set 2 to a power of numbers, such as 8, 16, and 32, etc. After step S906, if the accumulated number Nc is not equal to the system accumulated number threshold $N_{TH}$, the system waits for the predetermined time delay Δt (step S920) and then executes the step S904 again. If the accumulated number Nc is equal to the system accumulated number threshold $N_{TH}$, the mean RF gain Gain_mean is calculated according to the current RF gain sum Gain_sum (step S908), wherein Gain_mean=Gain_sum÷Nc. Thereafter, if Gain_mean<$G_{RF}^{TH1}$ and flag=0, the minimum TOP threshold of the IF gain $G_{IF}$ is changed from $G_{IF}^{min2}$ to $G_{IF}^{min3}$, and the parameter flag is set to 1 (steps S910 and S912). On the other hand, if the Gain_mean>$G_{RF}^{TH2}$ and flag=1, the minimum TOP threshold of the IF gain $G_{IF}$ is changed from $G_{IF}^{min3}$ to $G_{IF}^{min2}$, and the parameter flag is set to 0 (steps S914 and S916). Accordingly, whether the current minimum TOP threshold of the IF gains $G_{IF}$ is $G_{IF}^{min2}$ or $G_{IF}^{min3}$ can be determined according to the parameter flag. Finally, the accumulated number Nc and the RF gain sum Gain_sum are reset to 0 (step S918) and steps S920, S904, and S906 are repeated. As described above, the minimum TOP threshold of the IF gain $G_{IF}$ can be dynamically adjusted according to the accumulated RF gain.

Figure 10:
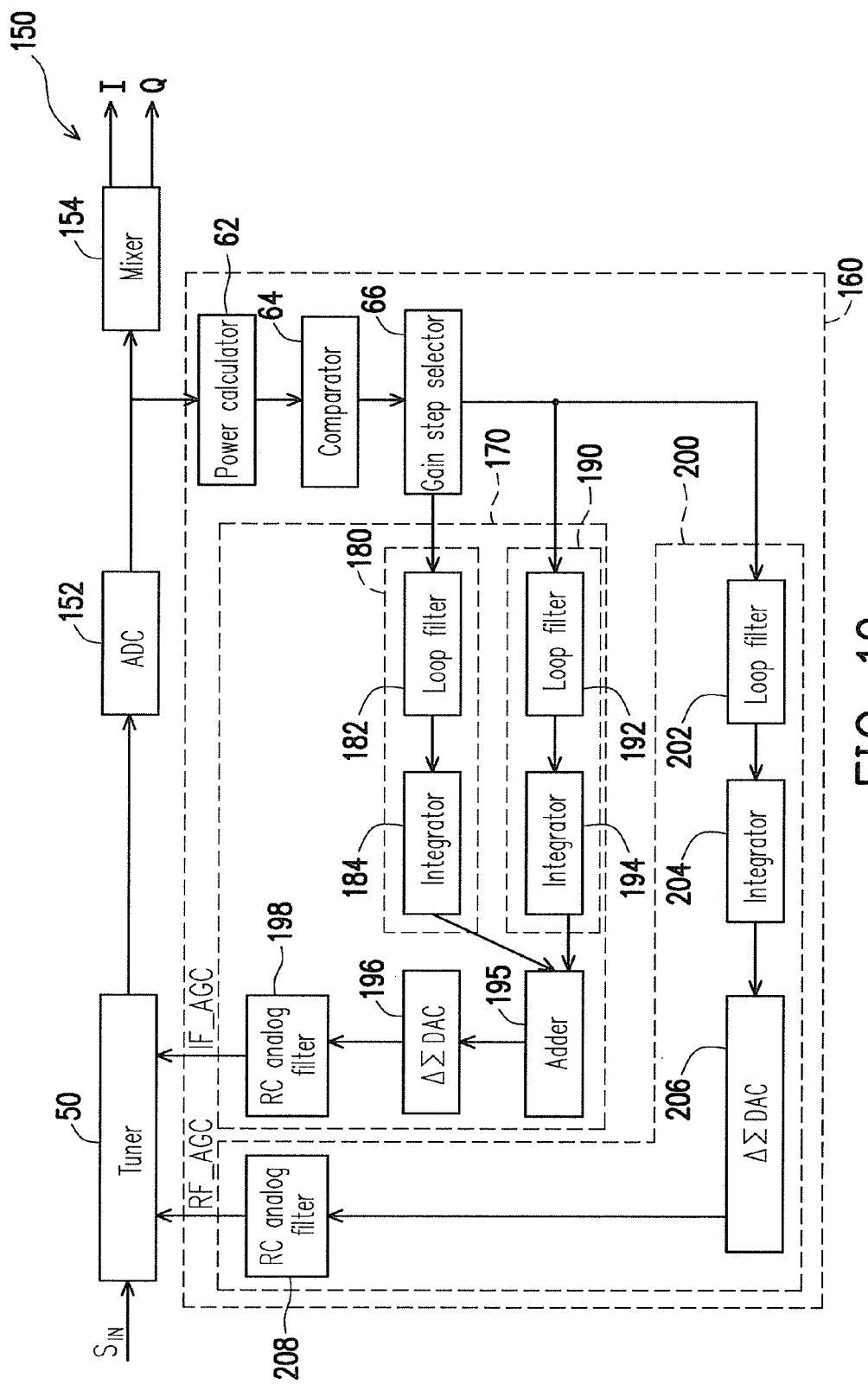
FIG. 10 is a functional block diagram of a receiver according to another embodiment of the present invention.

FIG. 10 is a functional block diagram of a receiver 150 according to another embodiment of the present invention. Referring to FIG. 10, besides the tuner 50 and an AGC 160, the receiver 150 further comprises an analog to digital converter (ADC) 152 and a mixer 154. The ADC 152 converts an analog signal outputted from the tuner 50 into a digital signal. The mixer 154 is a quadrature amplitude modulation (QAM) downmixer, which converts the digital signal outputted from the ADC 152 into a signal I and a signal Q orthogonal with the signal I. The AGC 160 has a power calculator 62, a comparator 64, a gain step selector 66, an IF AGC 170, and a RF AGC 200. The input terminal of the power calculator 62 is coupled to the output terminal of the ADC 152, and the power calculator 62 determines the strength of the input signal $S_{IN}$ according to the digital signal outputted from the ADC 152. The comparator 64 compares the strength of the input signal $S_{IN}$ with a predetermined threshold and controls the operation of the gain step selector 66 according to the comparison result. The input terminal of the gain step selector 66 is coupled to the output terminal of the comparator 64, and the gain step selector 66 turns on a first IF AGC loop 180 and/or a second IF AGC loop 190 of the IF AGC 170 in a stepping manner according to the comparison result of the comparator 64. For example, when the strength of the input signal $S_{IN}$ is lower than the predetermined threshold, the gain step selector 66 enables the first IF AGC loop 180 and disables the second IF AGC loop 190, and when the strength of the input signal $S_{IN}$ is greater than the predetermined threshold, the gain step selector 66 enables the second IF AGC loop 190 and disables the first IF AGC loop 180. Similarly, the RF AGC 200 and the IF AGC 170 respectively output a RF control signal RF_AGC and an IF control signal IF_AGC to the RF amplifier 54 and the IF amplifier 58 in the tuner 50 according to the strength of the input signal $S_{IN}$ determined by the power calculator 62, so as to control the gains of the IF amplifier 58 and the RF amplifier 54.

The first IF AGC loop 180 has a loop filter 182 and an integrator 184. Similarly, the second IF AGC loop 190 has a loop filter 192 and an integrator 194, and the RF AGC 200 has a loop filter 202 and an integrator 204. The loop filters 182, 192, and 202 are low-pass filters for filtering through the signal outputted from the gain step selector 66. The integrators 184, 194, and 204 respectively accumulate the signals outputted from the loop filters 182, 192, and 202.

The IF AGC 170 further comprises an adder 195, a delta-sigma digital to analog converter (ΔΣ DAC) 196, and a RC analog filter 198. The RF AGC 200 further comprises a ΔΣ DAC 206 and a RC analog filter 208. The adder 195 sums up the digital outputs of the integrators 184 and 194. However, because the second IF AGC loop 190 is disabled when the first IF AGC loop 180 is enabled or the first IF AGC loop 180 is disabled when the second IF AGC loop 190 is enabled, only one of the integrators 184 and 194 outputs a signal at same time. Thus, in another embodiment of the present invention, the adder 195 is omitted and the output terminals of the integrators 184 and 194 are directly coupled to the ΔΣ DAC 196. In the present embodiment, the ΔΣ DACs 196 and 206 respectively perform a delta-sigma digital to analog conversion for the outputs of the adder 195 and the integrator 204. However, in foregoing another embodiment of the present invention, since the adder 195 is omitted, the ΔΣ DAC 196 performs the delta-sigma digital to analog conversion for the output of the integrator 184 or the integrator 194. The RC analog filters 198 and 208 transform the AC outputted from the ΔΣ DACs 196 and 206 into DC to output (i.e., the RF control signal RF_AGC and the IF control signal IF_AGC).

FIG. 11 is a table comparing the performance of the receiver 150 and other devices in suppressing adjacent channel interference. Referring to FIG. 11, while comparing the performance of the receiver 150 and the devices A and B in adjacent channel interference suppression, in order to reflect the actual situation clearly in the comparison result, the strength of the input signal $S_{IN}$ in the viewed (watched) channel N is all set to 60 dBuV, and the maximum signal strength in adjacent channels (N+1) and (N−1) tolerable to the channel N are respectively observed with the frequency of the input signal $S_{IN}$ respectively at 500 MHz and 858 MHz. Regarding the tolerable maximum signal strength in adjacent channels, for example, when the frequency of the input signal $S_{IN}$ is 500 MHz, in the present invention, the maximum signal strength of the adjacent channel (N+1) tolerable to the channel N is 29.1 dB. Namely, a program received in the channel N is not affected by the signal of the adjacent channel (N+1) when the signal of the adjacent channel (N+1) is 29.1 dB greater than the signal of the channel N. In addition, while comparing the receiver 150 and the devices A and B, the symbol rate of the ADC 152 is always set to 6.875 MHz, and the mixer 154 adopts a 64-QAM program. As the table in FIG. 11 shows, compared to the devices A and B, the receiver 150 in an embodiment of the present invention can tolerate greater signal of adjacent channels. Thereby, the present invention provides better performance in adjacent channel interference suppression. FIG. 12 is a table comparing the performance of the receiver 150 and other devices in suppressing adjacent channel interference under another testing environment. The testing conditions in FIG. 12 are all the same as those in FIG. 11 except that the mixer 154 adopts a 256-QAM program. The table in FIG. 12 also reflects that the present invention has better performance in adjacent channel interference suppression.

FIG. 13 is a table comparing the signal-to-noise ratios (SNR) of the receiver 150 and other devices. The data in FIG. 13 is obtained respectively in different testing conditions including different QAM programs of the mixer 154, different symbol rates of the ADC 152, and the adoption of an additive white Gaussian noise (AWGN) channel. It can be understood from the table in FIG. 13 that the present invention has better performance in SNR.

Figure 14:
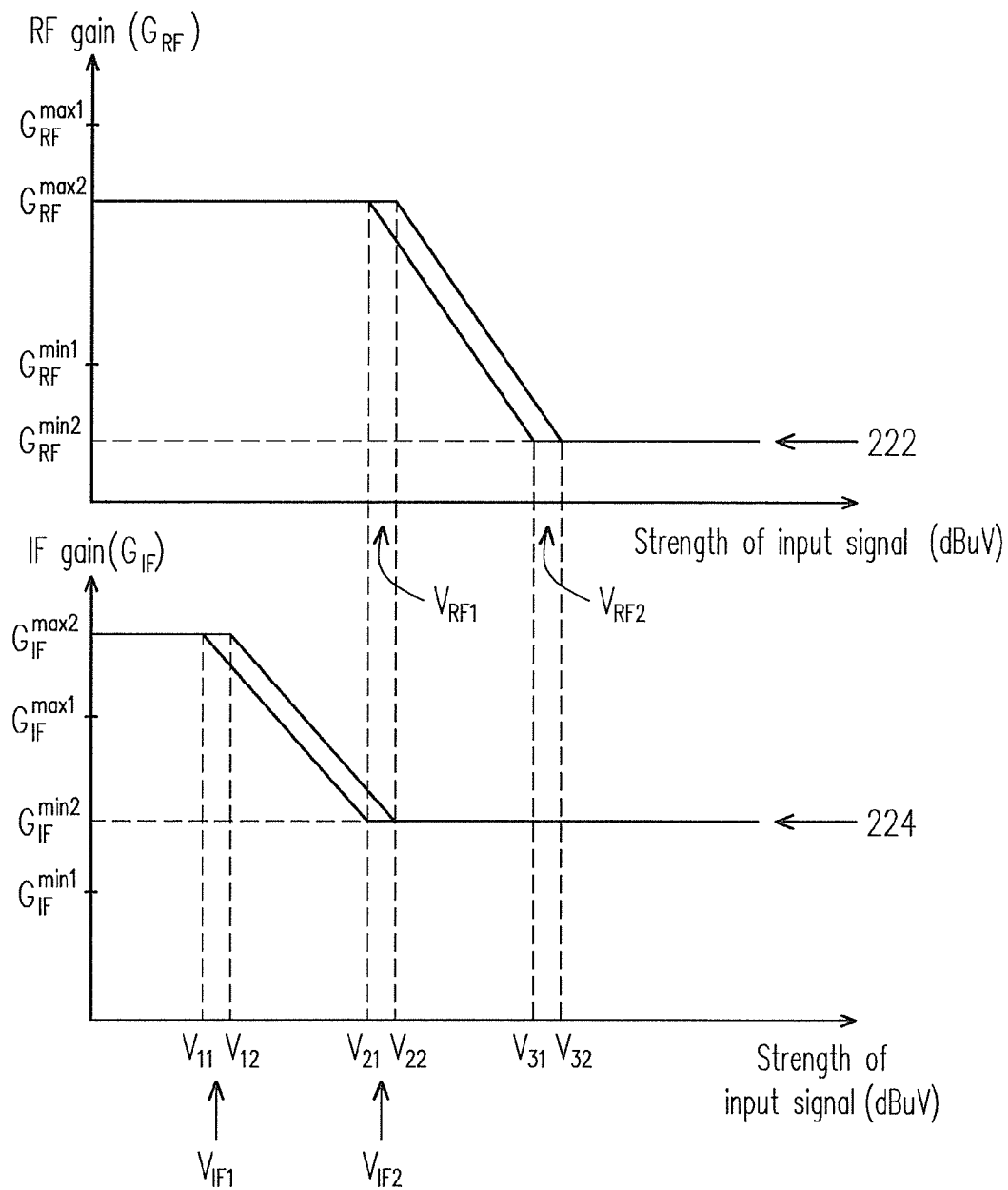
FIG. 14 illustrates a gain curve of a RF amplifier and a compensation gain curve of an IF amplifier according to a second embodiment of the present invention.

FIG. 14 illustrates a gain curve 222 of a RF amplifier and a compensation gain curve 224 of an IF amplifier according to a second embodiment of the present invention. Referring to both FIG. 14 and FIG. 4, $V_1$ in FIG. 4 is equivalent to $V_{IF1}$ in FIG. 14, $V_2$ in FIG. 4 is equivalent to $V_{RF1}$ and $V_{IF2}$ in FIG. 14, and $V_3$ in FIG. 4 is equivalent to $V_{RF2}$ in FIG. 14, wherein $V_{IF2}$ may be smaller than, equal to, or greater than $V_{RF1}$, and $V_{11} \leq V_{IF1} \leq V_{12}$, $V_{21} \leq V_{IF2} \leq V_{22}$, $V_{21} \leq V_{RF1} \leq V_{22}$, and $V_{31} \leq V_{RF2} \leq V_{32}$. As to the IF gain $G_{IF}$, when the strength of the input signal $S_{IN}$ is smaller than $V_{IF1}$, the IF gain $G_{IF}$ is equal to $G_{IF}^{max2}$; when the strength of the input signal $S_{IN}$ is between $V_{IF1}$ and $V_{IF2}$, the IF gain $G_{IF}$ is gradually reduced from $G_{IF}^{max2}$ to $G_{IF}^{min2}$ along with the increasing strength of the input signal $S_{IN}$; and when the strength of the input signal $S_{IN}$ is equal to $V_{IF2}$, the IF gain $G_{IF}$ is equal to $G_{IF}^{min2}$. As to the RF gain $G_{RF}$, when the strength of the input signal $S_{IN}$ is smaller than $V_{RF1}$, the RF gain $G_{RF}$ is equal to $G_{RF}^{max2}$; when the strength of the input signal $S_{IN}$ is between $V_{RF1}$ and $V_{RF2}$, the RF gain $G_{RF}$ is gradually reduced from $G_{RF}^{max2}$ to $G_{RF}^{min2}$ along with the increasing strength of the input signal $S_{IN}$; and when the strength of the input signal $S_{IN}$ is equal to $V_{RF2}$, the RF gain $G_{RF}$ is equal to $G_{RF}^{min2}$.

Figure 15:
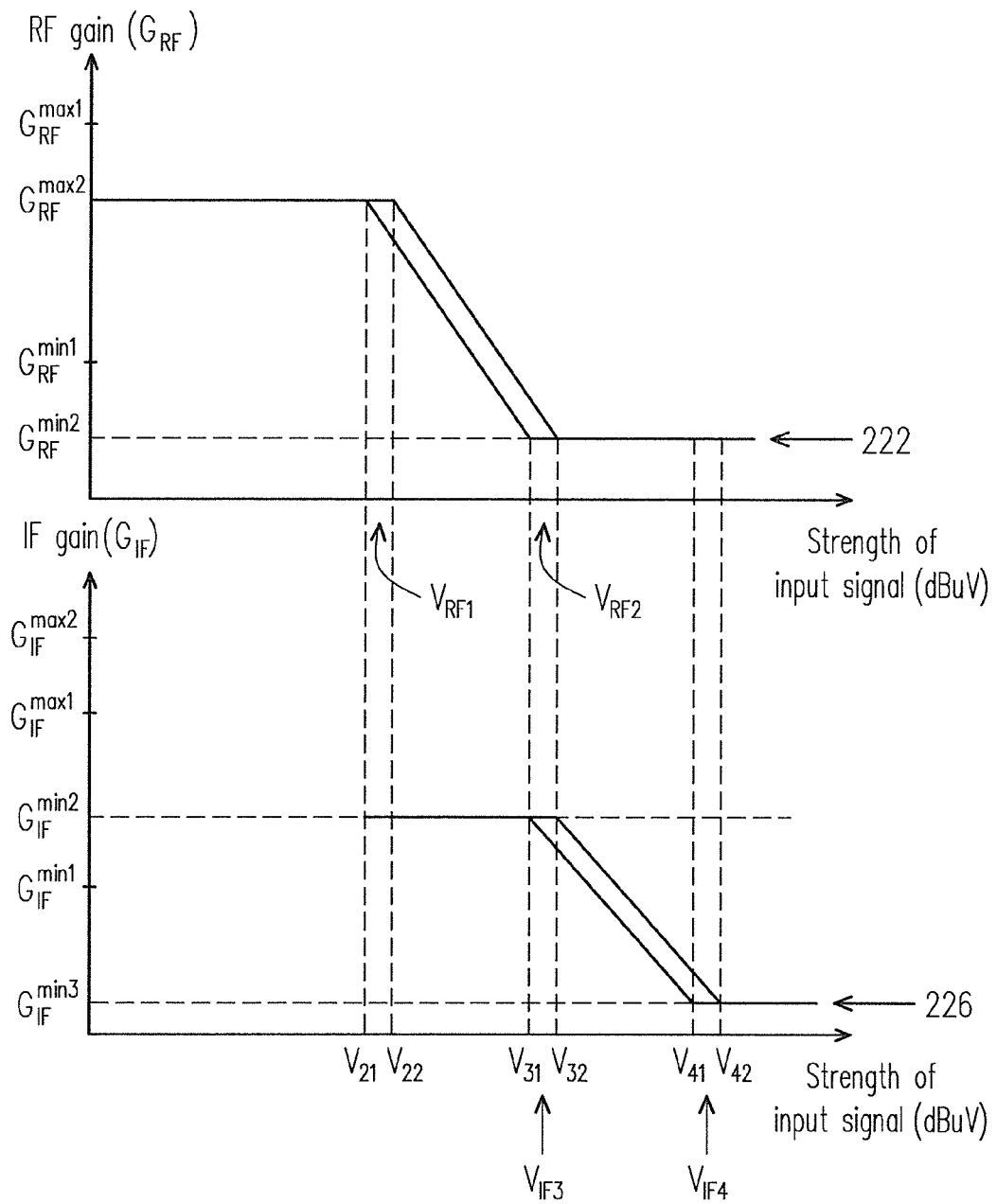
FIG. 15 illustrates the gain curve of the RF amplifier and a compensation gain curve of the IF amplifier according to the second embodiment of the present invention.

FIG. 15 illustrates the gain curve 222 of the RF amplifier and a compensation gain curve 226 of the IF amplifier according to the second embodiment of the present invention. Referring to both FIG. 15 and FIG. 5, the compensation gain curve 226, similar to the compensation gain curve 106, provides a gain compensation to the IF amplifier to control the gain $G_{IF}$ of the IF amplifier at an appropriate level and to prevent early overflow of signal power when the input signal $S_{IN}$ is has very high strength. $V_3$ in FIG. 5 is equivalent to $V_{RF2}$ and $V_{IF3}$ in FIG. 15, and $V_4$ in FIG. 5 is equivalent to $V_{IF4}$ in FIG. 15, wherein $V_{IF3}$ may be smaller than, equal to, or greater than $V_{RF3}$, and $V_{31} \leq V_{IF3} \leq V_{32}$, $V_{41} \leq V_{IF4} \leq V_{42}$. Similarly, the compensation gain curve 226 may also be obtained by adjusting the takeover point of the gain curve 224 of the IF amplifier.

Figure 16:
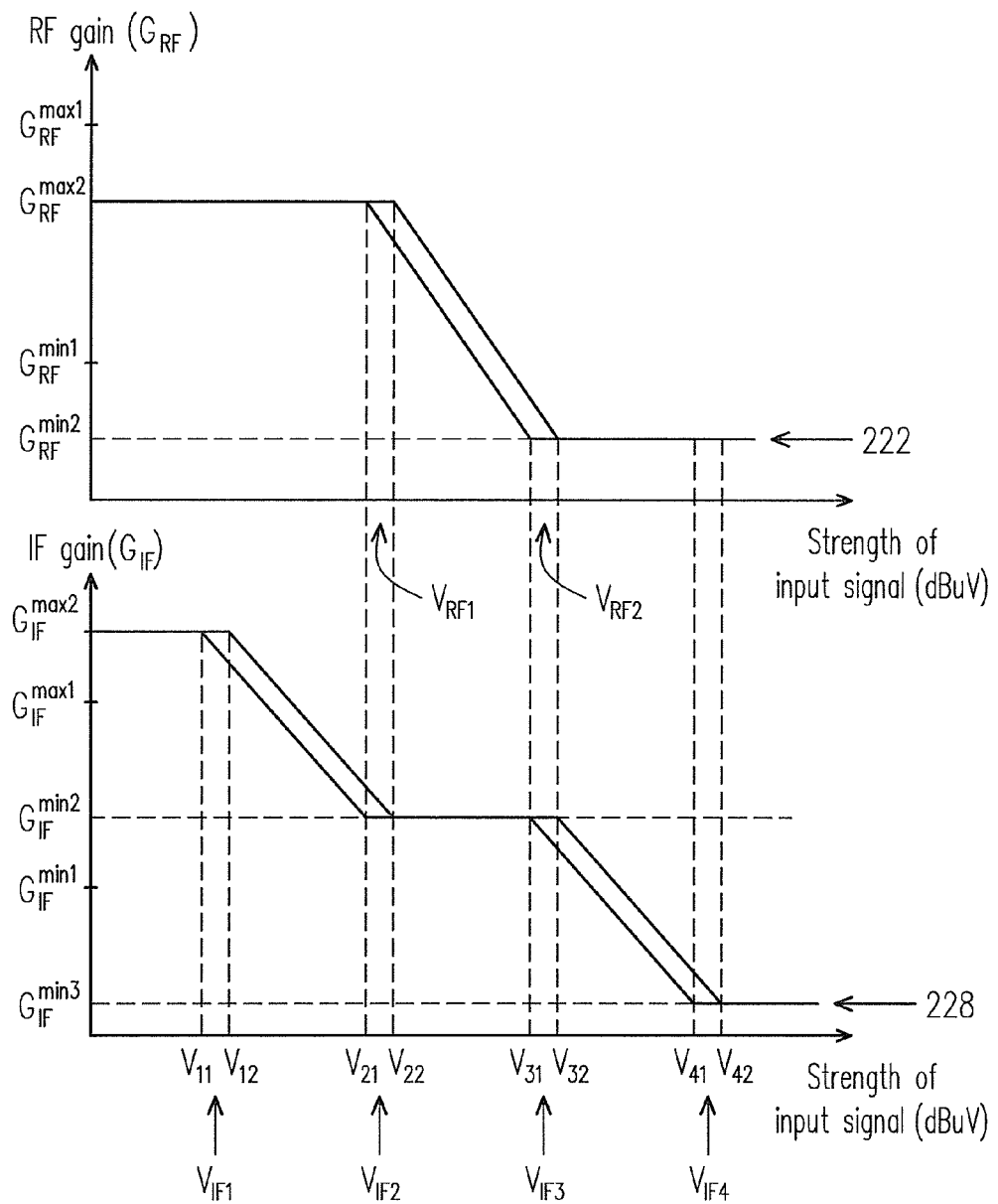
FIG. 16 illustrates the gain curve of the RF amplifier and an equivalent gain curve of the IF amplifier according to the second embodiment of the present invention.

FIG. 16 illustrates the gain curve 222 of the RF amplifier and an equivalent gain curve 228 of the IF amplifier according to the second embodiment of the present invention. Referring to FIG. 16, the equivalent gain curve 228 is obtained by integrating the gain curve 224 in FIG. 14 and the compensation gain curve 226 in FIG. 15.

As described above, in the present invention, the gain of a RF amplifier is lowered to suppress signal interference of adjacent channels, and the gain of an IF amplifier is raised to compensate for the loss of RF gain in a desired channel and to allow the IF amplifier to maintain a good linearity. Moreover, a gain compensation is provided to the IF amplifier to reduce the gain of the IF amplifier and to prevent early overflow of signal power when the input signal is very strong. Thereby, based on the auto gain control structure provided by the present invention, signal interference of adjacent channels can be suppressed, and meanwhile, the output quality is ensured even when strong input signals are received.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An auto gain control method, for controlling a gain of a radio frequency amplifier and a gain of an intermediate frequency amplifier and amplifying an input signal through the radio frequency amplifier and the intermediate frequency amplifier, the auto gain control method comprising:
   determining strength of the input signal;
   lowering a gain curve of the radio frequency amplifier and raising a gain curve of the intermediate frequency amplifier according to the determined strength of the input signal; and
   providing a gain compensation to the intermediate frequency amplifier to reduce the gain of the intermediate frequency amplifier when the strength of the input signal is greater than a threshold;
   wherein an output frequency range of the radio frequency amplifier is wider than an output frequency range of the intermediate frequency amplifier.

2. The auto gain control method according to claim 1, wherein the gain curve of the radio frequency amplifier represents a relationship between the gain of the radio frequency amplifier and the strength of the input signal, and the gain curve of the intermediate frequency amplifier represents a relationship between the gain of the intermediate frequency amplifier and the strength of the input signal.

3. The auto gain control method according to claim 1, wherein the gain curve of the intermediate frequency amplifier has takeover points and the step of providing a gain compensation to the intermediate frequency amplifier carries out by changing the takeover point from a first takeover point to a second takeover point.

4. The auto gain control method according to claim 1, wherein the input signal is first amplified by the radio frequency amplifier and then amplified by the intermediate frequency amplifier.

5. An auto gain control method of a three stage dual-loop controller circuit, for controlling a gain of a radio frequency amplifier and a gain of an intermediate frequency amplifier and amplifying an input signal through the radio frequency amplifier and the intermediate frequency amplifier, the auto gain control method comprising:
   determining strength of the input signal;
   lowering a gain curve of the radio frequency amplifier and raising a gain curve of the intermediate frequency amplifier if the strength of the input signal is lower than a threshold; and
   changing a takeover point of the gain curve of the intermediate frequency amplifier from a first takeover point to a second takeover point if the strength of the input signal is greater than the threshold, wherein the strength of the input signal corresponding to the second takeover point is greater than the strength of the input signal corresponding to the first takeover point, and the gain of the intermediate frequency amplifier corresponding to the second takeover point is smaller than the gain of the intermediate frequency amplifier corresponding to the first takeover point;
   wherein an output frequency range of the radio frequency amplifier is wider than an output frequency range of the intermediate frequency amplifier.

6. The auto gain control method according to claim 5, wherein the gain curve of the radio frequency amplifier represents a relationship between the gain of the radio frequency amplifier and the strength of the input signal, and the gain curve of the intermediate frequency amplifier represents a relationship between the gain of the intermediate frequency amplifier and the strength of the input signal.

7. The auto gain control method according to claim 5, wherein a gain compensation is provided to the intermediate frequency amplifier to reduce the gain of the intermediate frequency amplifier when the takeover point of the gain curve of the intermediate frequency amplifier is changed from the first takeover point to the second takeover point.

8. The auto gain control method according to claim 5, wherein the input signal is first amplified by the radio frequency amplifier and then amplified by the intermediate frequency amplifier.

9. An auto gain controller, comprising:
a power calculator, for determining strength of an input signal;
a comparator, coupled to the power calculator, for comparing the strength of the input signal with a predetermined threshold;
a gain step selector, coupled to the comparator;
a radio frequency auto gain controller, coupled to the gain step selector, for controlling a gain curve of a radio frequency amplifier; and
an intermediate frequency auto gain controller, coupled to the gain step selector, wherein the intermediate frequency auto gain controller has a first intermediate frequency auto gain control loop and a second intermediate frequency auto gain control loop for controlling an intermediate frequency gain of an intermediate frequency amplifier;
wherein the gain step selector turns on the first intermediate frequency auto gain control loop and the second intermediate frequency auto gain control loop in a stepping manner according to a comparison result of the comparator.

10. The auto gain controller according to claim 9, wherein the first intermediate frequency auto gain control loop, the second intermediate frequency auto gain control loop, and the radio frequency auto gain controller respectively comprise a loop filter and an integrator, wherein each of the loop filters is a low-pass filter for filtering through a signal outputted from the gain step selector, and each of the integrators accumulates a signal outputted from the corresponding loop filter.

11. The auto gain controller according to claim 10, wherein the intermediate frequency auto gain controller further comprises an adder, a delta-sigma digital to analog converter, and a RC analog filter, the adder sums up a digital output of the integrator of the first intermediate frequency auto gain control loop and a digital output of the integrator of the second intermediate frequency auto gain control loop, the delta-sigma digital to analog converter performs a delta-sigma digital to analog conversion for an output of the adder, and the RC analog filter transforms an alternating current outputted from the delta-sigma digital to analog converter into a direct current to output.

12. The auto gain controller according to claim 10, wherein the radio frequency auto gain controller further comprises a delta-sigma digital to analog converter and a RC analog filter, the delta-sigma digital to analog converter performs a delta-sigma digital to analog conversion for an output of the integrator of the radio frequency auto gain controller, and the RC analog filter transforms an alternating current outputted from the delta-sigma digital to analog converter into a direct current to output.

13. The auto gain controller according to claim 9, wherein when the strength of the input signal is smaller than the predetermined threshold, the gain step selector enables the first intermediate frequency auto gain control loop and disables the second intermediate frequency auto gain control loop, and when the strength of the input signal is greater than the predetermined threshold, the gain step selector enables the second intermediate frequency auto gain control loop and disables the first intermediate frequency auto gain control loop.

14. The auto gain controller according to claim 13, wherein the first intermediate frequency auto gain control loop raises the gain curve of the intermediate frequency amplifier when the strength of the input signal is smaller than the predetermined threshold.

15. The auto gain controller according to claim 13, wherein the second intermediate frequency auto gain control loop provides a gain compensation to the intermediate frequency amplifier to reduce the gain of the intermediate frequency amplifier when the strength of the input signal is greater than the predetermined threshold.

16. The auto gain controller according to claim 13, wherein the intermediate frequency auto gain controller further comprises a delta-sigma digital to analog converter and a RC analog filter, the delta-sigma digital to analog converter performs a delta-sigma digital to analog conversion for a digital output of the first intermediate frequency auto gain control loop or for a digital output of the second intermediate frequency auto gain controller loop, and the RC analog filter transforms an alternating current outputted from the delta-sigma digital to analog converter into a direct current to output.

* * * * *